(12) United States Patent
Kim

(10) Patent No.: US 10,613,765 B2
(45) Date of Patent: Apr. 7, 2020

(54) STORAGE DEVICE, METHOD FOR OPERATING THE SAME, AND STORAGE SYSTEM INCLUDING STORAGE DEVICES

(71) Applicant: SAMSUNG ELECTRONICS CO., LTD., Suwon-si, Gyeonggi-Do (KR)

(72) Inventor: Byoung Geun Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 4 days.

(21) Appl. No.: 15/986,157

(22) Filed: May 22, 2018

(65) Prior Publication Data

US 2019/0087100 A1   Mar. 21, 2019

(30) Foreign Application Priority Data

Sep. 20, 2017   (KR) .................. 10-2017-0121184

(51) Int. Cl.
*G06F 3/06* (2006.01)
*G06F 9/54* (2006.01)
(Continued)

(52) U.S. Cl.
CPC ............ *G06F 3/0611* (2013.01); *G06F 3/065* (2013.01); *G06F 3/0652* (2013.01);
(Continued)

(58) Field of Classification Search
CPC .............. G06F 3/0679; G06F 3/0611; G06F 2212/1016; G06F 2212/1024; G06F 2212/7208; G06F 2212/7201
See application file for complete search history.

(56) References Cited

U.S. PATENT DOCUMENTS 4,908,789 A * 3/1990 Blokkum ............ G06F 12/0653
                                                    711/115
5,206,939 A    4/1993 Yanai et al.
(Continued)

FOREIGN PATENT DOCUMENTS

JP          4369471      9/2009
KR       10-0323903      1/2002
(Continued)

OTHER PUBLICATIONS

Bo Hong, Scott A. Brandt, Darrel D. E. Long, Ethan L. Miller, Karen A. Glocer, Zachary N. J. Peterson, Zone-Based Shortest Positioning Time First Scheduling for MEMS-Based Storage device, University of California, Santa Cruz, IEEE, 2003. (Year: 2003).*
(Continued)

*Primary Examiner* — Khoa D Doan
(74) *Attorney, Agent, or Firm* — F. Chau & Associates, LLC

(57) ABSTRACT

A storage device includes a first non-volatile memory comprising a plurality of first banks having a plurality of first addresses and a second non-volatile memory comprising a plurality of second banks having a plurality of second addresses assigned to each according to different assignment policies, and a controller. The plurality of second addresses corresponds to the plurality of first addresses. The second non-volatile memory mirrors data items stored in the first addresses to store them in the second addresses. The controller is configured to receive a command from a host to control the first non-volatile memory and the second non-volatile memory. The controller provides a read command received from the host simultaneously to first and second non-volatile memories, and outputs to the host an earlier one between data provided from the first non-volatile memory
(Continued)

and data provided from the second non-volatile memory based on the read command.

18 Claims, 18 Drawing Sheets

(51) Int. Cl.
*G06F 12/10* (2016.01)
*G06F 13/16* (2006.01)
*G06F 12/02* (2006.01)
*G11C 16/04* (2006.01)

(52) U.S. Cl.
CPC .......... *G06F 3/0659* (2013.01); *G06F 3/0679* (2013.01); *G06F 9/544* (2013.01); *G06F 12/0246* (2013.01); *G06F 12/10* (2013.01); *G06F 13/16* (2013.01); *G06F 2212/1024* (2013.01); *G06F 2212/7201* (2013.01); *G06F 2212/7208* (2013.01); *G11C 16/0483* (2013.01)

(56) References Cited

U.S. PATENT DOCUMENTS

| | | | |
|---|---|---|---|
| 5,269,011 A | 12/1993 | Yanai et al. | |
| 5,335,352 A | 8/1994 | Yanai et al. | |
| 5,544,347 A | 8/1996 | Yanai et al. | |
| 5,664,144 A | 9/1997 | Yanai et al. | |
| 5,742,792 A | 4/1998 | Yanai et al. | |
| 5,889,935 A | 3/1999 | Ofek et al. | |
| 5,901,327 A | 5/1999 | Ofek | |
| 5,909,692 A | 6/1999 | Yanai et al. | |
| 5,959,930 A | 9/1999 | Sakurai | |
| 5,960,216 A | 9/1999 | Vishlitzky et al. | |
| 6,038,605 A | 3/2000 | Vishlitzky et al. | |
| 6,044,444 A | 3/2000 | Ofek | |
| 6,052,797 A | 4/2000 | Ofek et al. | |
| 6,173,377 B1 | 1/2001 | Yanai et al. | |
| 6,185,653 B1 | 2/2001 | Yanai et al. | |
| 6,247,046 B1 | 6/2001 | Yanai et al. | |
| 6,418,509 B1 | 7/2002 | Yanai et al. | |
| 6,502,205 B1 | 12/2002 | Yanai et al. | |
| 6,587,919 B2 | 7/2003 | Yanai et al. | |
| 6,625,705 B2 | 9/2003 | Yanai et al. | |
| 6,647,474 B2 | 11/2003 | Yanai et al. | |
| 7,055,059 B2 | 5/2006 | Yanai et al. | |
| 7,073,090 B2 | 7/2006 | Yanai et al. | |
| 7,234,029 B2 | 6/2007 | Khare et al. | |
| 7,240,238 B2 | 7/2007 | Yanai et al. | |
| 7,778,975 B2 | 8/2010 | Tsuchiya | |
| 7,945,752 B1 * | 5/2011 | Miller | G06F 3/0611 711/114 |
| 8,095,763 B2 | 1/2012 | Piszczek et al. | |
| 8,200,887 B2 | 6/2012 | Bennett | |
| 8,301,832 B1 | 10/2012 | Moore et al. | |
| 8,635,393 B2 * | 1/2014 | Dortu | G11C 7/1051 711/105 |
| 8,738,976 B2 | 5/2014 | Nakano et al. | |
| 8,898,408 B2 | 11/2014 | Berke et al. | |
| 9,195,407 B2 | 11/2015 | de la Iglesia | |
| 9,361,047 B2 | 6/2016 | Biederman et al. | |
| 2003/0135698 A1 | 7/2003 | Berg et al. | |
| 2003/0225988 A1 * | 12/2003 | Ralphs | G06F 3/0601 711/167 |
| 2004/0250021 A1 * | 12/2004 | Honda | G06F 3/0605 711/114 |
| 2005/0114587 A1 * | 5/2005 | Chou | G06F 13/385 711/103 |
| 2005/0172074 A1 * | 8/2005 | Sinclair | G06F 1/3268 711/114 |
| 2007/0030751 A1 | 2/2007 | Dortu et al. | |
| 2008/0175058 A1 * | 7/2008 | Kang | G11C 11/5642 365/185.11 |
| 2008/0215801 A1 * | 9/2008 | Tan | G11C 11/5621 711/103 |
| 2008/0301256 A1 * | 12/2008 | McWilliams | G06F 12/0284 709/214 |
| 2008/0316815 A1 * | 12/2008 | Lin | G11C 11/5628 365/185.03 |
| 2011/0246821 A1 * | 10/2011 | Eleftheriou | G06F 11/2087 714/15 |
| 2011/0258362 A1 | 10/2011 | McLaren et al. | |
| 2012/0144134 A1 | 6/2012 | Niwa | |
| 2013/0054937 A1 * | 2/2013 | Chen | G06F 12/0623 711/211 |
| 2014/0189201 A1 * | 7/2014 | Dhakshinamurthy | G06F 13/1684 711/103 |
| 2014/0304470 A1 * | 10/2014 | Shanbhag | G06F 3/065 711/114 |
| 2015/0012802 A1 * | 1/2015 | Avila | G06F 12/0246 714/773 |
| 2018/0032264 A1 * | 2/2018 | Gomez | G06F 3/065 |
| 2019/0026227 A1 * | 1/2019 | Yeh | G06F 12/0884 |

FOREIGN PATENT DOCUMENTS

| | | |
|---|---|---|
| KR | 10-0687628 | 2/2007 |
| KR | 1020150037985 | 4/2015 |
| WO | 199425919 | 11/1994 |
| WO | 2014008261 | 1/2014 |

OTHER PUBLICATIONS

Search and Examination Report dated Dec. 5, 2018 in corresponding Application No. SG10201805221R.

\* cited by examiner

FIG. 4A

| | BANK 0 | BANK 1 | BANK 2 | BANK 3 | |
|---|---|---|---|---|---|
| #0 | 0 | 1 | 2 | 3 | R1_0 |
| #1 | 4 | 5 | 6 | 7 | R1_1 |
| #2 | 8 | 9 | 10 | 11 | R1_2 |
| #3 | 12 | 13 | 14 | 15 | R1_3 |
| #4 | 16 | 17 | 18 | 19 | R1_4 |
| ... | ... | ... | ... | ... | |

| | BANK 0 | BANK 1 | BANK 2 | BANK 3 | |
|---|---|---|---|---|---|
| | 140_0 | 140_1 | 140_2 | 140_3 | |
| #0 | 0 | 1 | 2 | 3 | R2_0 |
| #1 | 7 | 4 | 5 | 6 | R2_1 |
| #2 | 10 | 11 | 8 | 9 | R2_2 |
| #3 | 13 | 14 | 15 | 12 | R2_3 |
| #4 | 16 | 17 | 18 | 19 | R2_4 |
| ... | ... | ... | ... | ... | |

FIG. 7A

| | BANK 0 | BANK 1 | BANK 2 | BANK 3 | |
|---|---|---|---|---|---|
| #0 | 0 | 1 | 2 | 3 | R1_0 |
| #1 | 4 | 5 | 6 | 7 | R1_1 |
| #2 | 8 | 9 | 10 | 11 | R1_2 |
| #3 | 12 | 13 | 14 | 15 | R1_3 |
| #4 | 16 | 17 | 18 | 19 | R1_4 |
| ... | ... | ... | ... | ... | |

|  | BANK 0 (140_0) | BANK 1 (140_1) | BANK 2 (140_2) | BANK 3 (140_3) |
|---|---|---|---|---|
| #0 | 0 | 1 | 2 | 3 |
| #1 | 7 | 4 | 5 | 6 |
| #2 | 10 | 11 | 8 | 9 |
| #3 | 13 | 14 | 15 | 12 |
| #4 | 16 | 17 | 18 | 19 |
| ... | ... | ... | ... | ... |

ERASE OPERATION
TIMING TABLE 1

| NVM 1 | 0 | 4 | 8 | 12 | 16 | ... | 4N |
|---|---|---|---|---|---|---|---|

| NVM 2 | 2 | 6 | 10 | 14 | 18 | ... | 4N+2 |

FIG. 12B

ERASE OPERATION
TIMING TABLE 2

| NVM 1 | NVM 2 |
|---|---|
| 0 | 2-k |
| 4 | 6-k |
| 8 | 10-k |
| 12 | 14-k |
| 16 | 18-k |
| ... | ... |
| 4N | 4N+2-k |

STORAGE DEVICE, METHOD FOR OPERATING THE SAME, AND STORAGE SYSTEM INCLUDING STORAGE DEVICES

CROSS-REFERENCE TO RELATED APPLICATION

This application claims priority under 35 U.S.C. 119 to Korean Patent Application No. 10-2017-0121184 filed on Sep. 20, 2017 in the Korean Intellectual Property Office, the disclosure of which is incorporated by reference in its entirety herein.

BACKGROUND

1. Technical Field

Exemplary embodiments of the present inventive concept relate to a storage device, a method for operating the same, and a storage system including storage devices.

2. Discussion of Related Art

Semiconductor memory devices are typically divided into a volatile memory device that fails to retain stored information when the power is interrupted, and a non-volatile memory device that retains stored information even if the power is interrupted. A NAND flash memory device is widely used as a non-volatile memory device.

A reading, programming, or erasing operation can be performed on a memory bank of a NAND flash memory device in response to corresponding commands. The delay time for the operation is represented by the sum of an execution time of the operation and a waiting time until a previous operation in the same memory bank has completed. However, the delay time of the operation may adversely affect a user's perception of the performance of the memory device. Thus, it is desirable to reduce latency in responding to read, program and erase commands.

SUMMARY

At least one embodiment of the present inventive concept provides a storage device including non-volatile memory devices each storing mirrored data.

At least one embodiment of the present inventive concept also provides a method for operating a storage device including non-volatile memory devices each storing mirrored data.

At least one embodiment of the present inventive concept also provides a storage system including storage devices each storing mirrored data.

According to an exemplary embodiment of the present inventive concept, a storage device includes a first non-volatile memory comprising a plurality of first banks having a plurality of first addresses assigned thereto according to a first assignment policy, a second non-volatile memory comprising a plurality of second banks having a plurality of second addresses assigned thereto according to a second assignment policy different from the first assignment policy, wherein the plurality of second addresses corresponds to the plurality of first addresses, and wherein the second non-volatile memory mirrors data items stored in the first addresses to store them in the second addresses, and a controller configured to receive a command from a host to control the first non-volatile memory and the second non-volatile memory, wherein the controller provides a read command received from the host simultaneously to the first non-volatile memory and the second non-volatile memory, and outputs to the host an earlier one between data provided from the first non-volatile memory and data provided from the second non-volatile memory based on the read command.

According to an exemplary embodiment of the present inventive concept, a storage system includes a first storage device comprising a plurality of first non-volatile memories having a plurality of first addresses assigned thereto according to a first assignment policy, a second storage device comprising a plurality of second non-volatile memories having a plurality of second addresses assigned thereto according to a second assignment policy different from the first assignment policy, wherein the plurality of second addresses corresponds to the plurality of first addresses, and wherein the second storage device mirrors data items stored in the first addresses to store them in the second addresses, and a host configured to control the first storage device and the second storage device, wherein the host issues a read request simultaneously to the first storage device and the second storage device, and outputs an earlier one between data provided from the first storage device and data provided from the second storage device.

According to an exemplary embodiment of the present inventive concept, a method for operating a storage device includes a first non-volatile memory comprising a plurality of first banks having a plurality of first addresses assigned thereto according to a first assignment policy, and a second non-volatile memory comprising a plurality of second banks having a plurality of second addresses assigned thereto according to a second assignment policy different from the first assignment policy, wherein the plurality of second addresses corresponds to the plurality of first addresses, and wherein the second non-volatile memory mirrors data items stored in the first addresses to store them in the second addresses, the method comprising a host issuing a read request to the storage device, a controller of the storage device applying a read command simultaneously to the first non-volatile memory and the second non-volatile memory based on the read request, and the controller outputting to the host an earlier one between data provided from the first non-volatile memory and data provided from the second non-volatile memory based on the read command.

According to an exemplary embodiment of the inventive concept, a storage device includes: a first non-volatile memory comprising M rows of N first banks having a plurality of first addresses, a second non-volatile memory comprising M rows of N second banks having a plurality of second addresses, and controller. The plurality of second addresses corresponds to the plurality of first addresses. The second non-volatile memory mirrors data items stored in the first addresses to store them in the second addresses. The controller is configured to provide a read command received from a host simultaneously to the first non-volatile memory and the second non-volatile memory, and output to the host an earlier one between data provided from the first non-volatile memory and data provided from the second non-volatile memory based on the read command. The controller shifts the first addresses belonging to a given row of the first banks by M mod N banks to determine the corresponding second banks of the second addresses.

BRIEF DESCRIPTION OF THE DRAWINGS

The present inventive concept will become more apparent by describing in detail exemplary embodiments thereof with reference to the attached drawings, in which:

FIG. 4A is a diagram for conceptually illustrating addresses assigned to a plurality of first banks included in the first non-volatile memory;

FIG. 4B is a diagram for conceptually illustrating addresses assigned to a plurality of second banks included in the second non-volatile memory;

FIG. 7A is a diagram for conceptually illustrating addresses and banks accessing the first non-volatile memory in response to a data read request;

FIG. 7B is a diagram for conceptually illustrating addresses and banks accessing the second non-volatile memory in response to a data read request according to an exemplary embodiment of the present inventive concept;

FIGS. 12A and 12B are tables for illustrating operation time synchronization between the first non-volatile memory and the second non-volatile memory according to an exemplary embodiment of the present inventive concept;

DETAILED DESCRIPTION OF THE EXEMPLARY EMBODIMENTS

Hereinafter, a storage device according to an exemplary embodiment of the present inventive concept, and a storage system including the same will be described with reference to FIGS. 1 to 14.

Figure 1:
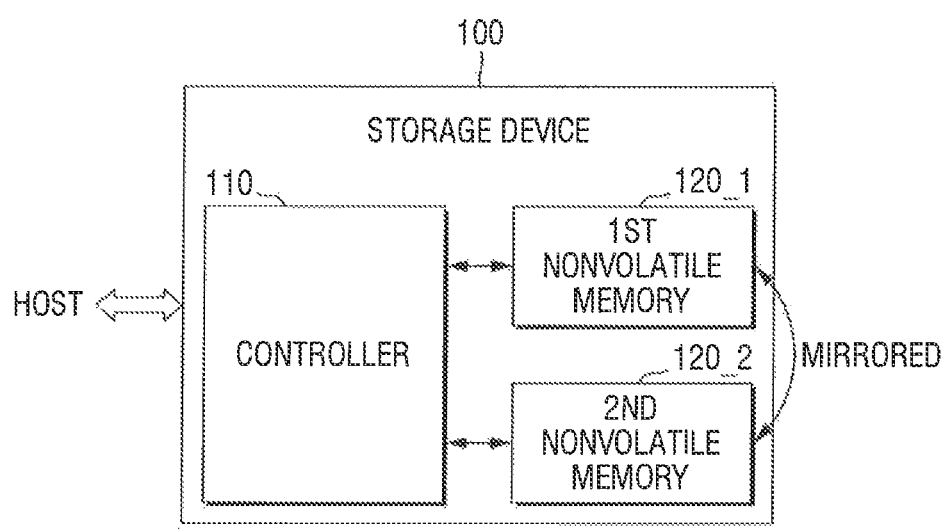
FIG. 1 is a block diagram for illustrating a storage device according to an exemplary embodiment of the present inventive concept.
Figure 2:
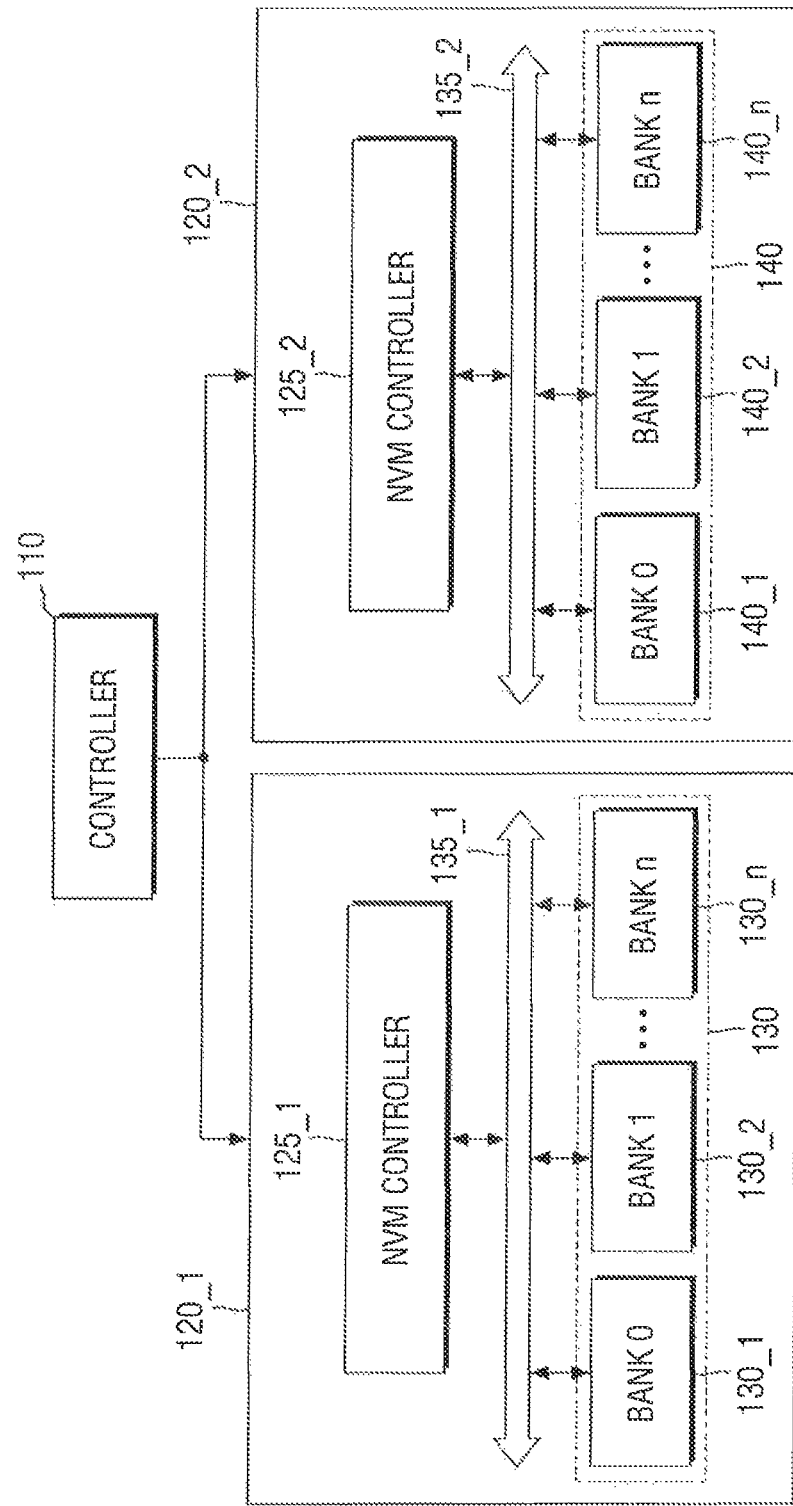
FIG. 2 is a block diagram for illustrating the storage device shown in FIG. 1 according to an exemplary embodiment of the present inventive concept.

FIG. 1 is a block diagram for illustrating a storage device according to an exemplary embodiment of the present inventive concept. FIG. 2 is a block diagram of the storage device shown in FIG. 1 in more detail.

Referring to FIGS. 1 and 2, a storage device 100 according to an exemplary embodiment of the present inventive concept includes a controller 110, a first non-volatile memory 120_1, and a second non-volatile memory 120_2.

The storage device 100 may connected to a host. The storage device 100 may receive a read command READ, a program command PROGRAM, and an erase command ERASE from the host and may perform an operation associated with each of the commands.

The storage device 100 may be, for example, a solid-state drive (SSD) composed of the first non-volatile memory 120_1 and the second non-volatile memory 120_2.

Alternatively, the storage device 100 may be, but is not limited to, a memory card such as a PC card or PCMCIA (personal computer memory card international association) card, a compact flash (CF) card, a smart media (SM) card or SMC, a memory stick, a multimedia card (MMC, RS-MMC or MMCmicro), an SD card, (SD, miniSD, microSD or SDHC) and a universal flash storage (UFS).

The controller 110 (e.g., a control circuit) may control the operation of the first non-volatile memory 120_1 and the second non-volatile memory 120_2. The controller 110 may control the first non-volatile memory 120_1 and the second non-volatile memory 120_2 based on a command received from a host. As will be described below, the first non-volatile memory 120_1 and the second non-volatile memory 120_2 are mirrored to each other. Accordingly, the controller 110 may provide the command received from the host equally to the first non-volatile memory 120_1 and the second non-volatile memory 120_2.

Figure 3:
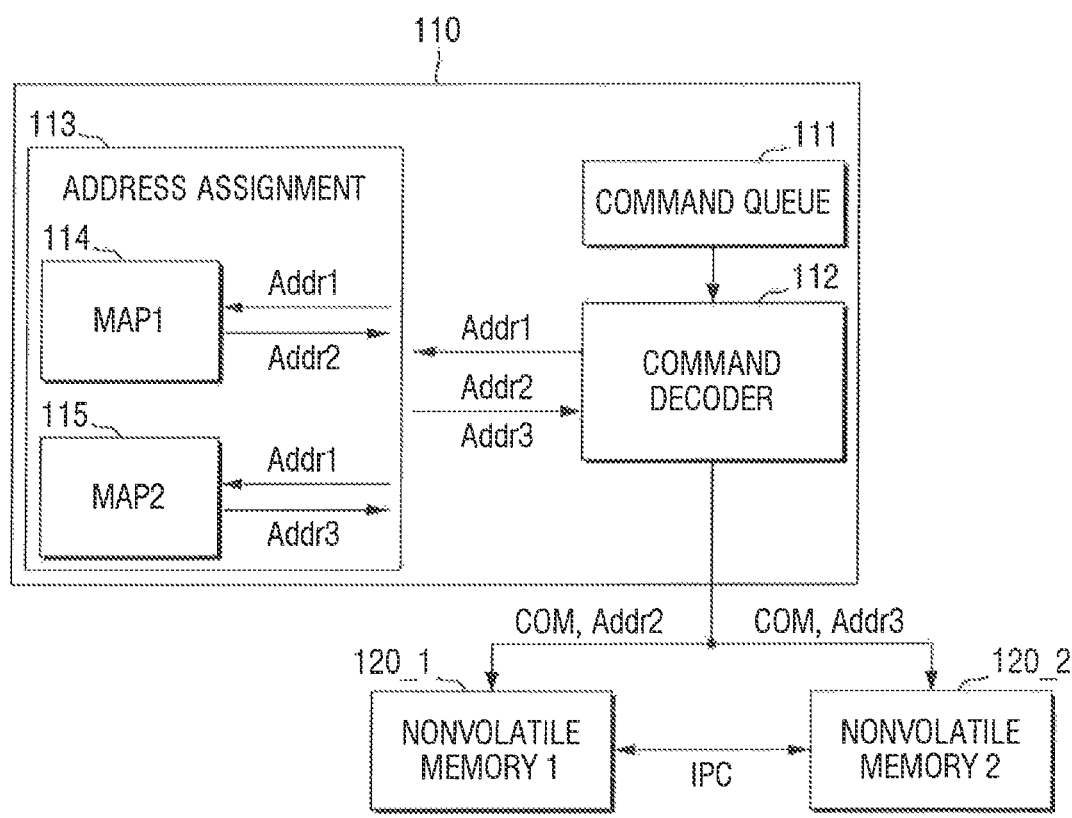
FIG. 3 is a block diagram for illustrating the controller of FIG. 1 according to an exemplary embodiment of the present inventive concept.

FIG. 3 is a block diagram illustrating the controller of FIG. 1 according to an exemplary embodiment of the inventive concept.

Referring to FIG. 3, the controller 110 includes a command queue 111, a command decoder 112, and an address assignment map 113.

The command queue 111 may temporarily store commands received by the controller 110 from the host and addresses on the first and second non-volatile memories 120_1 and 120_2 that the commands are to access. Accordingly, the command queue 111 may include a storage element (e.g., storage device, registers, buffers, etc.). The command queue 111 may provide the stored commands and addresses to the command decoder 112.

The command decoder 112 may decode commands and addresses received from the command queue 111. The command decoder 112 may provide decoded commands and addresses to the address assignment map 113. In an embodiment, the command decoder 112 is implemented by a decoder circuit.

The host may provide the controller 110 with logical addresses for accessing the first and second non-volatile memories 120_1 and 120_2. The logical addresses may include, for example, logical page numbers (LPNs).

In an embodiment, the controller 110 converts the logical addresses received from the host into actual physical addresses for accessing the first memory cell 130 and the second memory cell 140. The physical addresses may include, for example, physical page numbers (PPNs).

In an embodiment, the command decoder 112 converts the logical addresses received from the host to the physical addresses by using the address assignment map 113, and provides the converted physical addresses to the first and second non-volatile memories 120_1 and 120_2. The command decoder 112 may additionally provide a command (COM) to the non-volatile memories 120_1 and 120_2 corresponding to the converted physical addresses.

The address assignment map 113 includes a first map 114 and a second map 115 for use in converting a logical address received from a host into a physical address.

In the first map 114, the relationship between the physical addresses of the first non-volatile memory 120_1 and the logical addresses may be defined, for example, in the form of a table. Likewise, in the second map 115, the relationship between the physical addresses of the second non-volatile memory 120_1 and the logical addresses may be defined in the form of a table.

The command decoder 112 provides a first address Addr1 received from the host to the address assignment map 113. As described above, the first address Addr1 may include one or more logical addresses for accessing the first non-volatile memory 120_1 and the second non-volatile memory 120_2.

The address assignment map 113 converts the first address Addr1 into the second address Addr2 using the first map 114. The second address Addr2 may include one or more physical addresses for accessing the first non-volatile memory 120_1. Similarly, the address assignment map 113 converts the first address Addr1 into the third address Addr3 using the second map 115. The third address Addr3 may be one or more physical addresses for accessing the second non-volatile memory 120_2.

The command decoder 112 may provide the second address Addr2 and the third address Addr3 received from the address assignment map 113 to the first non-volatile memory 120_1 and the second non-volatile memory 120_2, respectively.

In summary, the controller 110 may convert the first address Addr1 included in a data access request received from the host into the second address Addr2 for accessing the first non-volatile memory 120_1, and may convert the first address Addr1 into the third address Addr3 for accessing the second non-volatile memory 120_2. In an embodiment, the two maps 114 and 115 are replaced with a single map that include entries indexable by the first address Addr1, where each entry include the corresponding second address Addr2 and third address Addr3.

The controller 110 may provide the data access request received from the host simultaneously to the first non-volatile memory 120_1 and the second non-volatile memory 120_2. For example, if the host issues a data read command for the first address Addr1, the controller 110 provides a read command for the second address Addr2 to the first non-volatile memory 120_1 and provides a read command for the third address Addr3 to the second non-volatile memory 120_2. The controller 110 may provide the read command simultaneously to the first non-volatile memory 120_1 and the second non-volatile memory, and may return read data from the first non-volatile memory 120_1 or read data from the second non-volatile memory 120_2, whichever has been completed earlier.

Referring again to FIG. 2, the first non-volatile memory 120_1 includes a first NVM controller 125_1 (e.g., a memory controller or a control circuit) and a first memory cell 130. The first NVM controller 125_1 may control the operation of the first memory cell 130 based on a command received from the controller 110. The first NVM controller 125_1 is connected to a first bus 135_1.

The first memory cell 130 may include, but is not limited to, NAND flash memory cells. That is, the first memory cell 130 may include a non-transitory memory cell that is capable of storing data on a semiconductor device, and any memory cell may be employed as long as it can cause a delay due to mutual interference of read, program and erase operations on the same bank.

In the following description, the first memory cell 130 is described as including a NAND flash memory cell. Although not explicitly shown in FIG. 2, the first memory cell 130 may be, but is not limited to, comprised of a plurality of NAND flash memory chips (i.e., integrated memory chips packaged into a single package). The first memory cell 130 may include a single NAND flash memory chip.

When the first memory cell 130 includes NAND flash memory cells, the first memory cell 130 may include a single-level cell (SLC). A SLC stores one bit of information per memory cell. Although a SLC has smaller capacity per memory cell than a multi-level cell (MLC) or a triple-level cell (TLC), it may have a lower latency required for accessing data than the MLC and the TLC. It is to be understood that the first memory cell 130 is not limited to the SLC.

The first non-volatile memory 120_1 includes a plurality of banks 130_1, 130_2, ..., 130_n. Each of the plurality of banks 130_1 to 130_n is a unit of address with which the controller 110 performs a read, a program or an erase operation.

The second non-volatile memory 120_2 includes a second NVM controller 125_2 and a second memory cell 140. The second NVM controller 125_2 may control the operation of the second memory cell 140 based on a command received from the controller 110. The second NVM controller 125_2 is connected to a second bus 135_2.

The second memory cell 140 may have the same configuration as the first memory cell 130. Thus, the second memory cell 140 may include a non-transitory memory cell that is capable of storing data on a semiconductor device, such as a NAND flash memory cell. Likewise, the second memory cell 140 is not limited to a NAND flash cell, and may include any memory device as long as it can cause a delay due to mutual interference of read, program and erase operations on the same bank.

In the following description, the second memory cell 140 will be described as a NAND flash memory cell like the first memory cell 130 for convenience of discussion.

In an embodiment, the first memory cell 130 and the second memory cell 140 are mirrored to each other. Accordingly, the first memory cell 130 and the second memory cell 140 stores the same data. The controller 110 may access areas on the first memory cell 130 and the second memory cell 140 in which the same data is stored according to the command and address provided from the host, and may perform the same command for the first memory cell 130 and the second memory cell 130. In an embodiment, a first part of the data stored in the first memory cell 130 in a first location is stored in the second memory cell 140 in a second location different from the first location, and a second part of the data is stored in a same third location in both the second memory cell 130 and the third memory cell 140.

FIG. 4A is a diagram for conceptually illustrating addresses assigned to a plurality of first banks included in the first non-volatile memory. FIG. 4B is a diagram for conceptually illustrating addresses assigned to a plurality of second banks included in the second non-volatile memory.

First, referring to FIG. 4A, the first non-volatile memory 120_1 includes a plurality of banks 130_0, 130_1, 130_2, and 130_3. Although the first non-volatile memory 120_1 is shown as including four banks of the zeroth bank 130_0 to the third bank 130_3 for convenience of illustration, it is to be understood that this is merely illustrative. For example, the first non-volatile memory 120_1 may include fewer or more than four banks.

In addition, the first non-volatile memory 120_1 may be divided into a plurality of rows R1_0, R1_1, R1_2, R1_3, R1_4. Each of the plurality of banks 130_0, 130_1, 130_2, and 130_3 may include respective ones of logical addresses 0 to 19 each assigned to one of the plurality of rows R1_0 to R1_4.

For example, addresses 0, 4, 8, 12 and 16 are included in the zeroth bank 130_0 of the first non-volatile memory 120_1. Addresses 1, 5, 9, 13 and 17 are included in the first bank 130_1. Addresses 2, 6, 10, 14 and 18 are included in the second bank 130_2. Addresses 3, 7, 11, 15 and 19 are included in the third bank 130_3. In this manner, the logical addresses of the first non-volatile memory 120_1 may be sequentially assigned to the plurality of banks 130_0 to 130_3.

Among the logical addresses assigned to the plurality of banks 130_0 to 130_3, the address 4 may be represented by the physical address of, for example, the first row of the zeroth bank (BANK0, #1). In another example, the address 11 may be represented by the physical address of the second row of the third bank (BANK3, #2).

As described above, the first non-volatile memory 120_1 performs read, program and erase commands bank-by-bank. If a read command for addresses 0 and 4 are received from the host, the first non-volatile memory 120_1 cannot process it at once. That is, the first non-volatile memory 120_1 has to read the data in the zeroth bank 130_0 over two data cycles and then provide the data to the host. This is a so-called bank collision. For example, the first non-volatile memory 120_1 reads the data associated with address 0 in the zeroth bank 130_0 during a first data cycle and reads the data associated with address 4 in the zeroth bank 130_0 during a second data cycle after the read associated with address 0 has completed.

On the contrary, let us assume that a read command for the data stored in address 0 and address 1 is received in the first non-volatile memory 120_1 from the host. Since the address 0 is assigned to the zeroth bank 130_0 and the address 1 is assigned to the first bank 130_1, the first non-volatile memory 120_1 may read the data stored in the address 0 and the address 1 in a single data cycle and provide the data to the host.

In a typical NAND flash memory device, it is known that a memory cell processes read and program requests page by page. Thus, as described herein, processing a read request bank-by-bank in the first and second non-volatile memories 120_1 and 120_2 may be interpreted as processing a read request page-by-page. It is to be understood that this is merely illustrative and the plurality of banks included in the first and second non-volatile memories 120_1 and 120_2 may refer to the plurality of pages.

Referring to FIG. 4B, the second non-volatile memory 120_2 has a configuration similar to that of the first non-volatile memory 120_1. It is to be understood that the second non-volatile memory 120_2 mirrors and stores the data stored in the first non-volatile memory 120_1.

Specifically, the second non-volatile memory 120_2 includes the same number of banks as the first non-volatile memory 120_1, and the same number of logical addresses assigned to the banks as the first non-volatile memory 120_1. However, the assignment policy for assigning logical addresses to the same banks is different. For example, when different assignment policies are used for different non-volatile memories, a given read request applied to both non-volatile memories may result in fewer bank collisions in one of the non-volatile memories.

Although the second non-volatile memory 120_2 is shown in FIG. 4B as including four banks of the zeroth bank 140_0 to the third bank 140_3 for convenience of illustration, it is to be understood that this is merely illustrative. For example, the second non-volatile memory 120_2 may include fewer or more than four banks.

The second non-volatile memory 120_2 is divided into a plurality of rows R2_0 to R2_4. Each of the plurality of banks 140_0, 140_1, 140_2, and 140_3 may include respective ones of logical addresses 0 to 19 each assigned to one of the plurality of rows R2_0 to R2_4.

For example, addresses 0, 7, 10, 13, 12 and 16 are included in the zeroth bank 140_0 of the second non-volatile memory 120_2. Addresses 1, 4, 11, 14 and 17 are included in the first bank 140_1. Addresses 2, 5, 8, 15 and 18 are included in the second bank 140_2. Addresses 3, 6, 9, 12 and 19 are included in the third bank 140_3.

Among the logical addresses assigned to the plurality of banks 140_0 to 140_3, the address 4 may be represented by the physical address of, for example, the first row of the first bank (BANK1, #1). For another example, the address 12 may be represented by the physical address of the third row of the third bank (BANK3, #3).

Compared to the logical addresses assigned to the plurality of banks 130_0 to 130_3 of the first non-volatile memory 120_1, the logical addresses of the second non-volatile memory 120_2 assigned to the plurality of banks 140_0 to 140_3 have been shifted to neighboring banks by several logical addresses.

Specifically, the addresses 0 to 3 in the zeroth row R2_0 of the second non-volatile memory 120_2 are sequentially assigned to the zeroth to third banks 140_0 to 140_3. The addresses 4 to 7 in the first row R2_1 are shifted by one bank to be assigned to the next banks. The addresses 8 to 11 in the second row R2_2 are shifted by two banks to be assigned to the adjacent banks. The addresses 13 and 14 in the third row R2_3 are shifted by three banks to be assigned to the adjacent banks. To generalize it, when a non-volatile memory includes n banks, addresses belonging to the $m^{th}$ row are shifted by m mod n banks to be assigned, where mod is the modulo operation.

As such, the addresses included in the second non-volatile memory 120_2 may be assigned to the plurality of banks 140_1 to 140_3 in a manner different from the manner that addresses of the first non-volatile memory 120_1 are assigned to the plurality of banks 130_1 to 130_3.

Although the bank assignment policy of addresses included in the second non-volatile memory 120_2 has been described above with reference to FIG. 4B, the present disclosure is not limited thereto. The addresses included in the second non-volatile memory 120_2 may be assigned to the plurality of banks 140_0 to 140_3 according to a different policy as long as it has sequentiality.

The first non-volatile memory 120_1 and the second non-volatile memory 120_2 have different address assignment policies, which relates to the method for operating a storage device according to an exemplary embodiment of the present inventive concept. The operation of the storage device will be described in more detail with reference to FIGS. 5 to 7B.

Figure 5:
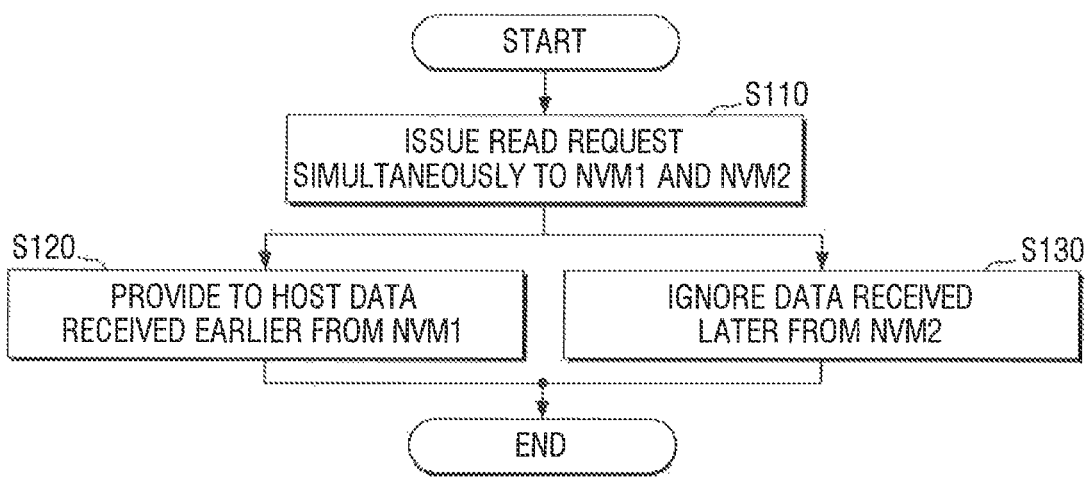
FIG. 5 is a flowchart illustrating an operation of a storage device according to an exemplary embodiment of the present inventive concept.
Figure 6:
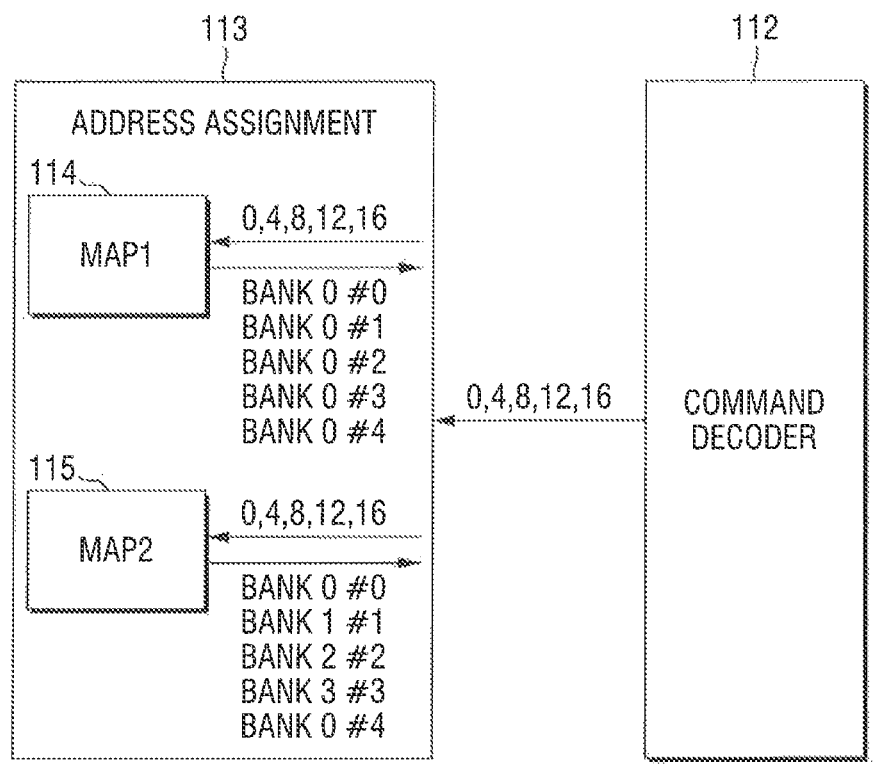
FIG. 6 is a diagram for conceptually illustrating an operation of the controller when a data read request is provided to the first non-volatile memory and the second non-volatile memory according to an exemplary embodiment of the present inventive concept.
Figure 7A:
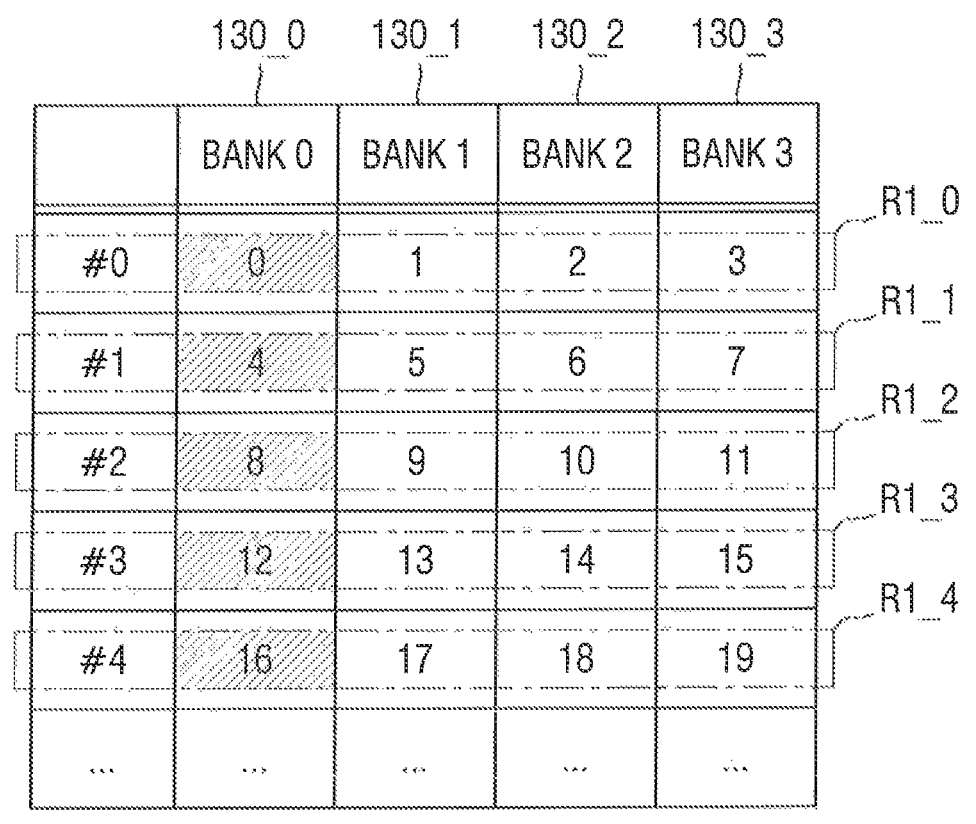

FIG. 5 is a flowchart illustrating an operation of a storage device according to an exemplary embodiment of the present inventive concept. FIG. 6 is a diagram for conceptually illustrating an operation of the controller when a data read request is provided to the first non-volatile memory and the second non-volatile memory according to an exemplary embodiment of the present inventive concept. FIG. 7A is a diagram for conceptually illustrating addresses and banks accessing the first non-volatile memory in response to a data read request. FIG. 7B is a diagram for conceptually illustrating addresses and banks accessing the second non-volatile memory in response to a data read request according to an exemplary embodiment of the present inventive concept.

Referring to FIG. 5, the storage device 100 according to an exemplary embodiment of the present inventive concept sends a read request to the first non-volatile memory 120_1 and the second non-volatile memory 120_2 simultaneously (step S110). Then, the data received earlier from the first non-volatile memory 120_1 is provided to the host (step S120), while the data received later from the second non-volatile memory 120_2 is ignored (step S130).

Typically, data mirroring is used for data backup purposes. In the storage device according to an exemplary embodiment of the present inventive concept, by providing a read command simultaneously to the first non-volatile memory 120_1 and the second non-volatile memory 120_2 that mirrors the first non-volatile memory 120_1 (step S110), the latency due to the read request can be improved. In an embodiment, the controller 110 does not provide the ignored data to the host. If the data is instead received earlier from the second non-volatile memory 120_2, this data can be provided to the host, while the data received later from the first non-volatile memory 120_1 is ignored.

Referring to FIG. 6, the operation of the command decoder 112 and the address assignment map 113 is shown when the controller 110 receives a read command for the logical addresses 0, 4, 8, 12 and 16 from the host.

The command decoder 112 provides a first addresses Addr1 including the addresses 0, 4, 8, 12 and 16 to the address assignment map 113. The address assignment map 113 returns to the command decoder 112 the second address Addr2 converted from the first address Addr1 using the first map 114. FIG. 6 shows an example in which the address assignment map 113 returns physical addresses corresponding to the zeroth to fourth rows of the zeroth bank (BANK0, #0 to #4).

The address assignment map 113 returns to the command decoder 112 the third address Addr3 converted from the first address Addr1 using the second map 115. FIG. 6 shows an example in which the address assignment map 113 returns physical addresses of the zeroth row of the zeroth bank (BANK0, #0), the first row of the first bank (BANK1, #1), the second row of the second bank (BANK2, #2), the third row or and the third bank (BANK3, #3), and the fourth row of the zeroth bank (BANK0, #4).

The controller 110 may access the first non-volatile memory 120_1 and the second non-volatile memory 120_2 based on the physical addresses provided to the command decoder 112 from the address assignment map 113.

Referring to FIG. 7A, the logical addresses 0, 4, 8, 12 and 16 are assigned to the zeroth bank 130_0. Since the physical addresses corresponding to the logical addresses 0, 4, 8, 12 and 16, respectively, are located in the zeroth to 4th rows of the zeroth bank (BANK0, #0 to #4), at least four bank collisions occur for the read request from the host. As a result, the latency for the read request increases, which may adversely affect data parallelism.

Referring to FIG. 7B, the logical addresses 0, 4, 8, 12 and 16 are assigned across the zeroth to third banks 130_0 to 130_3 appropriately. In the example shown in FIG. 7B, only one data collision occurs for the read request from the host. If the second non-volatile memory 120_2 also assigned the logical addresses to the plurality of banks 140_1 to 140_3 according to the same policy, there may be four bank collisions like in the first non-volatile memory 120_1.

Accordingly, the second non-volatile memory 120_2 may first process the read request from the host and provide the data read earlier to the controller 110. The controller 110 may provide the data received from the second non-volatile memory 120_2 to the host. On the other hand, the data read from the first non-volatile memory 120_1 may be ignored by the controller 110.

It is to be understood that the above example is ideal for the second non-volatile memory 120_2. If the host issues a read command for different logical addresses, there may be a different latency.

However, according to an exemplary embodiment of the present inventive concept, the second non-volatile memory 120_2 that mirrors the first non-volatile memory 120_1 employs a policy for assigning logical addresses to the plurality of banks 140_1 to 140_3 that is different from the policy of the first non-volatile memory 120_1, thereby suppressing bank collisions for the same read request, less than in the first non-volatile memory 120_1.

Accordingly, the controller 110 can return the data read from the first non-volatile memory 120_1 or the data read from the second non-volatile memory 120_2, whichever is received earlier, in response to the read request from the host. In other words, the controller 110 can provide the host with data received from the first non-volatile memory 120_1 or the data received from the second non-volatile memory 120_2, whichever has less bank collisions.

The latency of the first non-volatile memory 120_1 and the second non-volatile memory 120_2 with respect to the read request from the host may be determined based on other factors, in addition to the bank collision described above. In a storage device according to an exemplary embodiment of the present inventive concept, it is assumed that the processing of the read request is delayed by a previously processed erase or program request.

Figure 8:
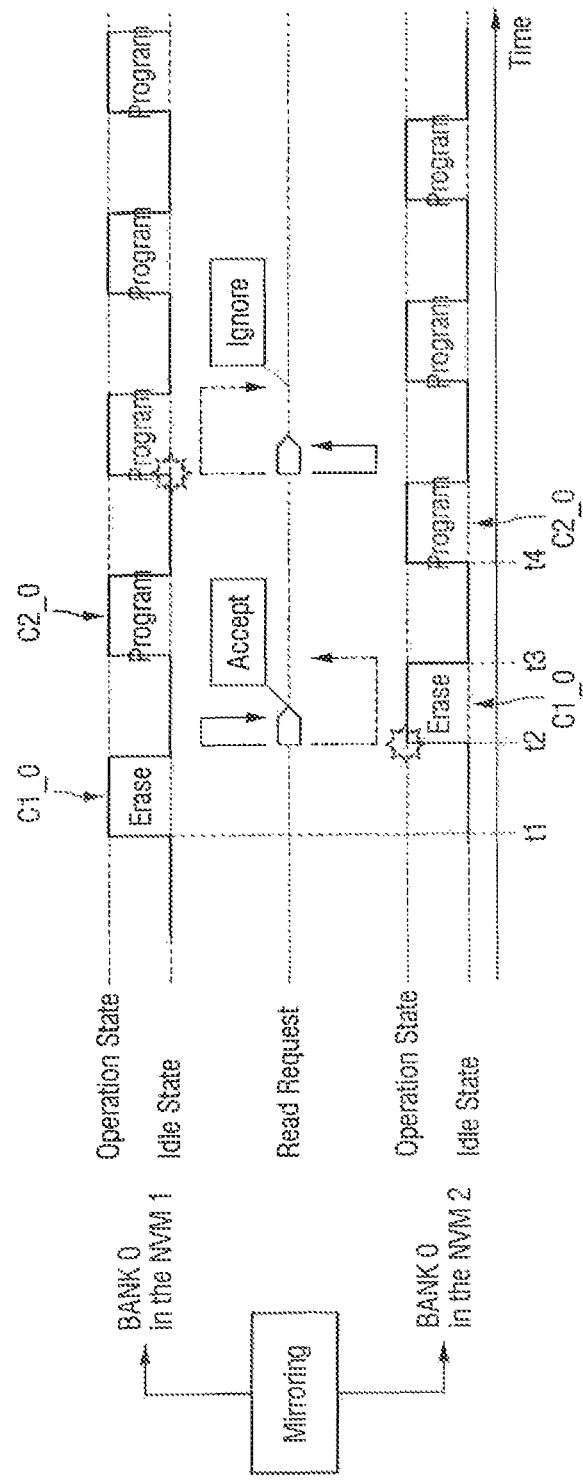
FIG. 8 is a timing diagram for illustrating an operation of the storage device according to an exemplary embodiment of the present inventive concept.

FIG. 8 is a timing diagram for illustrating an operation of the storage device according to an exemplary embodiment of the present inventive concept.

Referring to FIG. 8, an example is shown in which there is a read request for the zeroth bank 130_0 of the first non-volatile memory 120_1 and the zeroth bank 140_0 of the second non-volatile memory 120_2. Prior to each read request, an erase or program command from the host is sent to the storage device 100, and the storage device 100 may process it.

For example, it is assumed that a read request is received from the host to the zeroth banks 130_0 and 140_0 of the first non-volatile memory 120_1 and the second non-volatile memory 120_2 at a second time point t2, and the first non-volatile memory 120_1 and the second non-volatile memory 120_2 are processing an erase command for the zeroth banks 130_0 and 140_0 from the host at the second time point t2.

As described above, since the first non-volatile memory 120_1 cannot simultaneously process different commands for the same bank, the first non-volatile memory 120_1 cannot process the read command until the erase command for the zeroth bank has completed. Likewise, the second non-volatile memory 120_2 cannot simultaneously process different commands for the same bank, the second non-volatile memory 120_2 cannot process the read command until the erase command for the zeroth bank has completed.

In order to avoid a situation in which the two non-volatile memories 120_1 and 120_2 are waiting for the completion of processing of the previous erase/program command for the same bank, the first non-volatile memory 120_1 and the second non-2 non-volatile memory 120_2 process the erase/program command mutually exclusively. For example, while the first non-volatile memory 120_1 is processing an erase command for the zeroth bank, the second non-volatile memory 120_2 does not process the erase command for the zeroth bank.

Specifically, as shown in FIG. 8, the first non-volatile memory 120_1 starts to process an erase command C1_0 at a first time point t1, and completes the processing of the erase command C1_0 at the second time point t2. The second non-volatile memory 120_2 starts to process an erase command C1_1 at the second time point t2 and completes the processing of the erase command C1_1 at the third time point t3. The erase command C1_0 issued to the first non-volatile memory 120_1 is identical to the erase command C1_1 issued to the second non-volatile memory 120_2, and includes an erase request for the same logical address.

If a read command from the host is issued at the second time point t2, the second non-volatile memory 120_2, which has not completed the processing of the erase command C1_1, cannot start the processing of the read command at the second time point t2. On the other hand, the first non-volatile memory 120_1, which has completed the processing of the erase command C1_0, can start and complete the processing of the read command earlier.

Hereinafter, the operation of the storage device 100 in which the first non-volatile memory 120_1 and the second non-volatile memory 120_2 mutually exclusively process an erase/program command issued from the host will be described.

Figure 9:
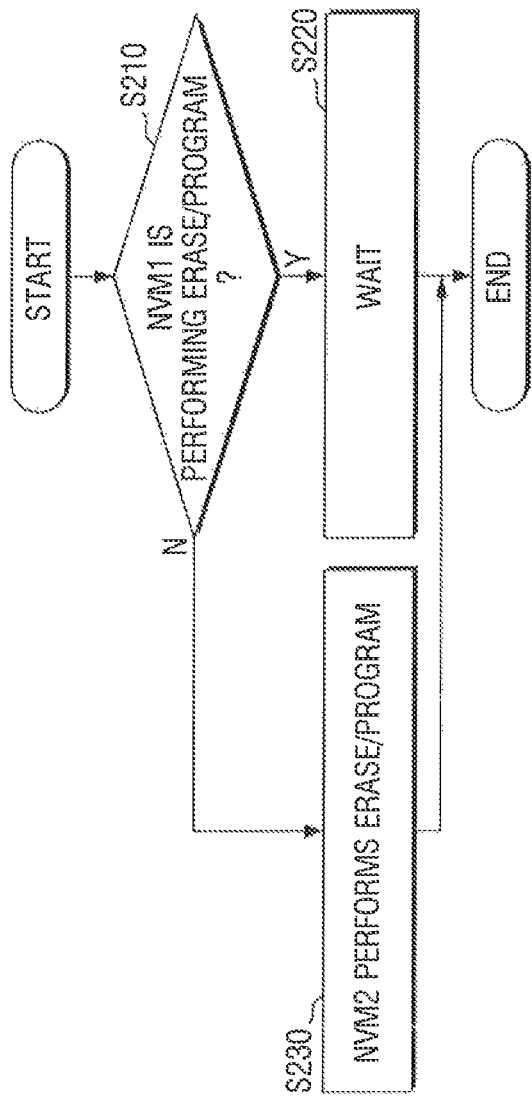
FIG. 9 is a flowchart illustrating an operation of a storage device according to an exemplary embodiment of the present inventive concept.

FIG. 9 is a flowchart illustrating an operation of a storage device according to an exemplary embodiment of the present inventive concept.

Referring to FIG. 9, it is checked whether the erase/program command is being processed in the first non-volatile memory 120_1 (step S210). When the erase/program command is being processed in the first non-volatile memory 120_1, the second non-volatile memory 120_2 waits without processing the erase/program command (step S220). If the erase/program command is not being processed in the first non-volatile memory 120_1 or the processing has completed, the second non-volatile memory 120_2 processes the erase/program command (step S230).

The operations of the first non-volatile memory 120_1 and the second non-volatile memory 120_2 described in FIG. 9 are merely illustrative. That is, as shown in FIG. 9, the second non-volatile memory 120_2 can check whether the first non-volatile memory 120_1 is processing the erase/program command. It is to be understood that the first non-volatile memory 120_1 can also check whether the second non-volatile memory 120_2 is processing the erase/program command.

Figure 10A:
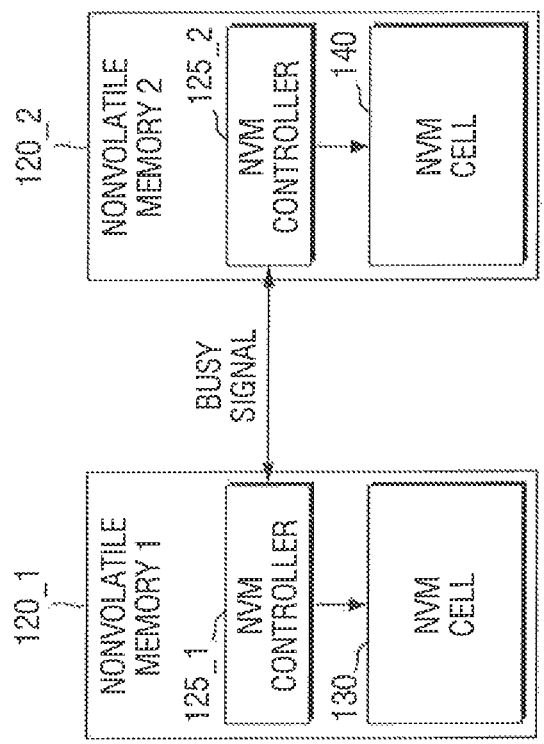
FIGS. 10A and 10B are diagrams for illustrating inter-process communications (IPC) between the first non-volatile memory and the second non-volatile memory according to an exemplary embodiment of the present inventive concept.
Figure 10B:
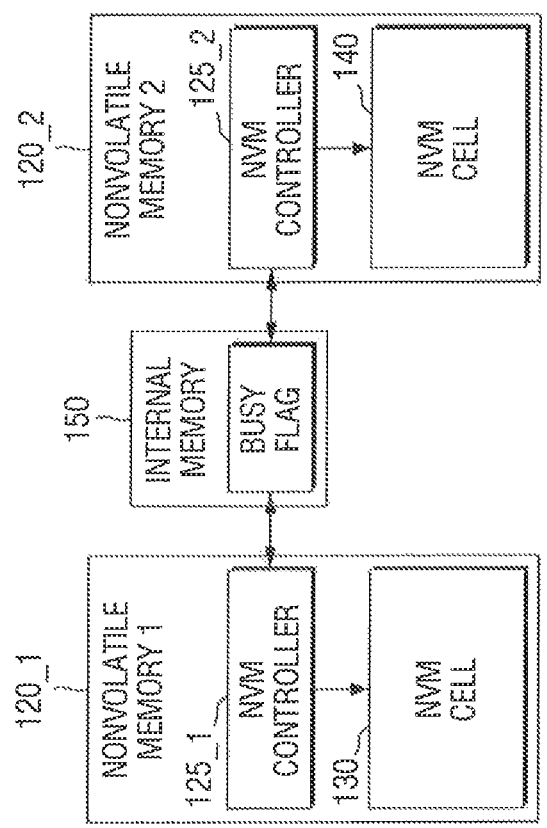

FIGS. 10A and 10B are diagrams for illustrating inter-process communications (IPC) between the first non-volatile memory and the second non-volatile memory according to an exemplary embodiment of the present inventive concept.

Referring to FIG. 10A, the second non-volatile memory 120_2 may use the IPC to check whether the first non-volatile memory 120_1 is processing the erase/program command. Specifically, a channel is formed between the first NVM controller 125_1 and the second NVM controller 125_2, such that it may be checked whether the first non-volatile memory 120_1 or the second non-volatile memory 120_2 is processing an erase/program command via the channel.

For example, while the first non-volatile memory 120_1 is processing an erase/program command, the first NVM controller 125_1 sends a busy signal to the second NVM controller 125_2. The first NVM controller 125_1 stops sending the busy signal when the processing of the erase/program command has completed. While the first NVM controller 125_1 is sending the busy signal, the second NVM controller 125_2 recognizes that the first non-volatile memory 120_1 is processing an erase/program command and waits until the processing of the erase/program command has completed.

Likewise, while the second non-volatile memory 120_2 is processing an erase/program command, the second NVM controller 125_2 sends a busy signal to the first NVM controller 125_1. The second NVM controller 125_2 stops sending the busy signal when it completes the processing of the erase/program command. While the second NVM controller 125_2 is sending the busy signal, the first NVM controller 125_1 recognizes that the second non-volatile memory 120_2 is processing an erase/program command and waits until the processing of the erase/program command has completed.

The IPC between the first non-volatile memory 120_1 and the second non-volatile memory 120_2 described above may be performed without the controller 110, for example. For example, the IPC may be handled by the controllers 125_1 and 125_2.

Referring to FIG. 10B, the storage device 100 further includes an internal memory 150 for the IPC in an alternate embodiment. The internal memory 150 stores a busy flag indicating whether the first non-volatile memory 120_1 or the second non-volatile memory 120_2 is processing an erase/program command.

For example, while the first non-volatile memory 120_1 is processing an erase/program command, the first NVM controller 125_1 sets a busy flag to one. In an embodiment, the first NVM controller 125_1 sets the busy flag to zero when it completes the processing of the erase/program command. The second NVM controller 125_2 checks the busy flag before processing an erase/program command. While the busy flag is set to one, the second NVM controller 125_2 recognizes that the first non-volatile memory 120_1 is processing an erase/program command and waits until the processing of the erase/program command has completed.

For example, while the second non-volatile memory 120_2 is processing an erase/program command, the second NVM controller 125_1 sets the busy flag to one. The second NVM controller 125_2 sets the busy flag to zero when the processing of the erase/program command has completed. The first NVM controller 125_1 checks the busy flag before processing an erase/program command. While the busy flag is set to one, the first NVM controller 125_1 recognizes that the second non-volatile memory 120_2 is processing an erase/program command and waits until the processing of the erase/program command has completed. In an embodiment, a mechanism is used to prevent the controllers 125_1 and 125_2 from simultaneously setting the busy flag. For example, the timing at which the controllers 125_1 and 125_2 attempt to set the busy flag can be adjusted so they cannot simultaneously set the busy flag.

Likewise, the IPC between the first non-volatile memory 120_1 and the second non-volatile memory 120_2 using the internal memory 150 may be performed without the controller 110, for example.

Figure 11:
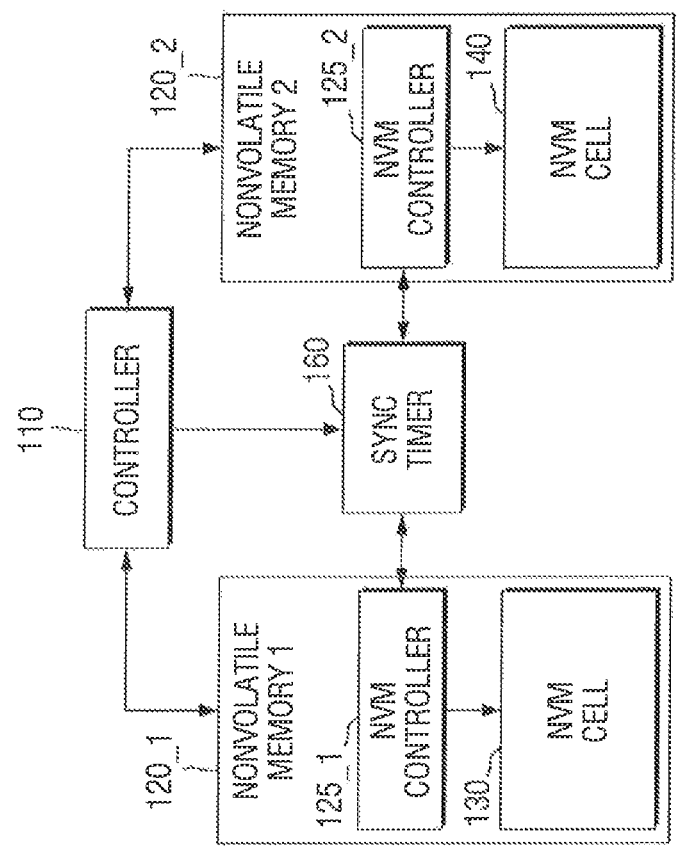
FIG. 11 is a block diagram for illustrating operation time synchronization of a first non-volatile memory and a second non-volatile memory according to an exemplary embodiment of the present inventive concept.

FIG. 11 is a block diagram for illustrating an operation time synchronization of a first non-volatile memory and a second non-volatile memory according to an exemplary embodiment of the present inventive concept. FIGS. 12A and 12B are tables for illustrating the operation time synchronization between the first non-volatile memory and the second non-volatile memory according to an exemplary embodiment of the present inventive concept.

Referring to FIGS. 11 to 12B, an operation of processing an erase/program command received from a host exclusively by the first non-volatile memory 120_1 or the second non-volatile memory 120_2 of the storage device 100 according to an exemplary embodiment of the present inventive concept will be described.

The storage device 100 includes a synchronization timer 160 (e.g., a timer circuit). The synchronization timer 160 provides a time synchronization signal to the first non-volatile memory 120_1 and the second non-volatile memory 120_2. The time synchronization signal provided by the synchronization timer 160 to the first and second non-volatile memories 120_1 and 120_2 may be, for example, a clock signal, and more specifically, may be a real-time clock (RTC) signal.

The first NVM controller 125_1 receives a time synchronization signal from the synchronization timer 160. The first NVM controller 125_1 starts the processing of the erase/program command based on the time synchronization signal.

The second NVM controller 125_2 receives a time synchronization signal from the synchronization timer 160. The second NVM controller 125_2 starts the processing of the erase/program command based on the time synchronization signal.

FIG. 12A depicts a table showing an example of start time points of the processing of erase commands by the first non-volatile memory 120_1 and the second non-volatile memory 120_2. The unit of the numbers is milliseconds (ms). The first and second non-volatile memories 120_1 and 120_2 process the erase command after times indicated by the numbers have elapsed from a reference time point. It is assumed that it takes 2 ms for the first and second non-volatile memories 120_1 and 120_2 to process the erase command.

The first non-volatile memory 120_1 starts the processing of the erase command after the times of 0, 4, 8, 12, 16, . . . , 4N ms have elapsed from the reference time point. Referring back to FIG. 8, for example, the first time point t1 is 0 ms after the reference time point, and the third time point t3 is 4 ms after the reference time point. The first non-volatile memory 120_1 starts the processing of the erase command at predetermined time intervals from the reference time point.

The second non-volatile memory 120_2 starts the processing of the erase command after the times of 2, 6, 10, 14, 18, . . . , 4N ms have elapsed from the reference time point. Referring to FIG. 8, the second time point t2 is 2 ms after the reference time point, and the fourth time point t4 is 6 ms after the reference time point. That is, the second non-volatile memory 120_2 may start the processing of the erase command at predetermined time intervals after an offset time (for example, 2 ms) has elapsed from the reference time point.

The first NVM controller 125_1 sets the reference time point based on the time synchronization signal provided from the synchronization timer 160. The first NVM controller 125_1 may issue an erase/program command to the first memory cell 130 at predetermined time intervals from the reference time point.

The second NVM controller 125_2 sets the reference time point based on the time synchronization signal provided from the synchronization timer 160. The second NVM controller 125_2 may issue an erase/program command to the second memory cell 130 at predetermined time intervals from the reference time point. The offset time may be, for example, a time required for the first non-volatile memory 120_1 or the second non-volatile memory 120_2 to process the erase/program command.

By doing so, the second non-volatile memory 120_2 waits without processing the erase/program command while the first non-volatile memory 120_1 processes the erase/program command. That is, the processing times of erase/program commands of the first non-volatile memory 120_1 and the second non-volatile memory 120_2 are mutually exclusive, without overlapping each other.

FIG. 12B depicts a table showing an example in which the processing times of erase commands by the first non-volatile memory 120_1 and the second non-volatile memory 120_2 partially overlap with one another, unlike the example shown in FIG. 12A.

The operation of the first non-volatile memory 120_1 is the same as that described above with reference to FIG. 12A; and, therefore, the redundant description will be omitted.

The second non-volatile memory 120_2 starts the processing of the erase commands after times of 2–k, 6–k, 10–k, 14–k, 18–k, . . . , (4N+2)–k ms have been elapsed from the reference time point (e.g., k may be an integer such as 1). That is, the times that the second non-volatile memory 120_2 processes the erase/program commands may overlap with the times that the first non-volatile memory 120_1 processes the erase/program commands by k ms.

In other words, in the example shown in FIG. 12B, the processing times of the erase/program commands by the first non-volatile memory 120_1 and the second non-volatile memory 120_2 are partially overlapped.

In an exemplary embodiment of the present inventive concept, the k value satisfies the condition $0 \leq k < m$, depending on the user's settings, where m is a time taken for processing an erase/program command.

Figure 13:
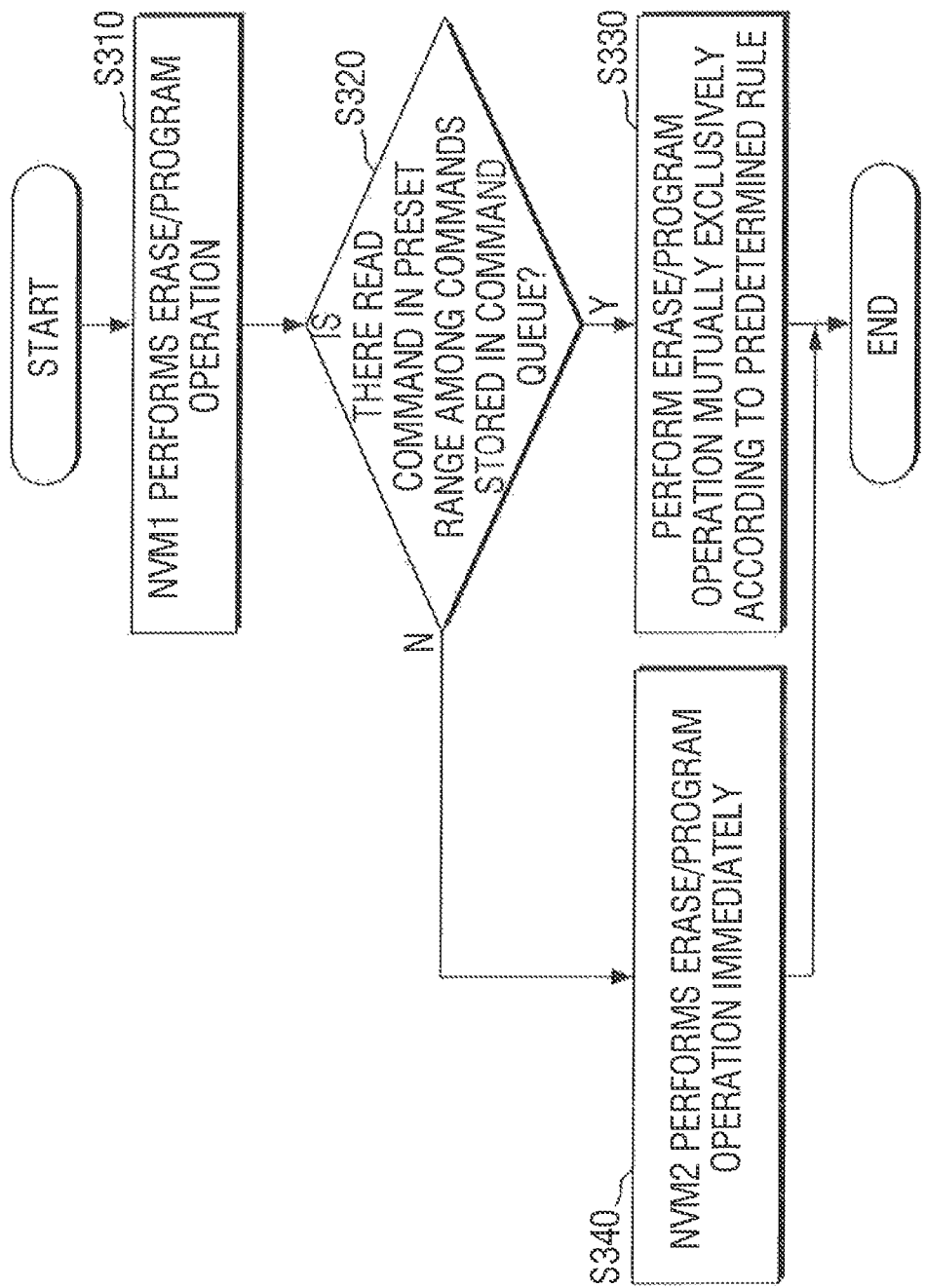
FIG. 13 is a flowchart for illustrating an erase/program operation of a first non-volatile memory and a second non-volatile memory according to an exemplary embodiment of the present inventive concept.

FIG. 13 is a flowchart for illustrating erase/program operation of a first non-volatile memory and a second non-volatile memory according to an exemplary embodiment of the present inventive concept.

Referring to FIG. 13, according to an exemplary embodiment of the present inventive concept, the second non-volatile memory 120_2 performs an erase/program command even while the first non-volatile memory 120_1 is performing the erase/program command. As described above, the second non-volatile memory 120_2 can check whether the first non-volatile memory 120_1 is processing the erase/program command, and the first non-volatile memory 120_1 can also check whether the second non-volatile memory 120_2 is processing the erase/program command.

Initially, the erase/program operation is started in the first non-volatile memory 120_1 (step S310).

Subsequently, a command corresponding to the same erase/program operation is provided to the second non-volatile memory 120_2. The second non-volatile memory 120_2 checks if there is a read command for the second non-volatile memory 120_2 in a preset range among the commands stored in the command queue 111 (step S320). For example, the second NVM controller 125_2 may access the command queue 111 to check whether there is a read command provided to the second non-volatile memory 120_2 within the preset range.

If there is no read command provided to the second non-volatile memory 120_2 within the preset range, the second non-volatile memory 120_2 performs the erase/program operation immediately (S340). In this case, the second non-volatile memory 120_2 does not check whether the first non-volatile memory 120_1 is performing the erase/program operation.

If there is a read command provided to the second non-volatile memory 120_2 within the preset range, the second non-volatile memory 120_2 performs an erase/program operation exclusively according to a predetermined rule (S330). For example, the predetermined rule corresponds to the rules described above with reference to FIGS. 9 to 12B. In an embodiment, a read command is in the preset range when an address stored with the read command in the command queue 111 is greater than or equal to a first address and less than or equal to a second address.

As mentioned earlier, the second non-volatile memory 120_2 checks whether the first non-volatile memory 120_1 is performing the erase/program operation so that the first non-volatile memory 120_1 and the second non-volatile memory 120_2 can process the erase/program command mutually exclusively, thereby reducing the latency of the read command. However, if there is no read command in the preset range among the commands stored in the command queue 111, it is not necessary to process the erase/program command mutually exclusively between the first and second non-volatile memories 120_1 and 120_2. Thus, the second non-volatile memory 120_2 may process the erase/program command immediately.

Figure 14:
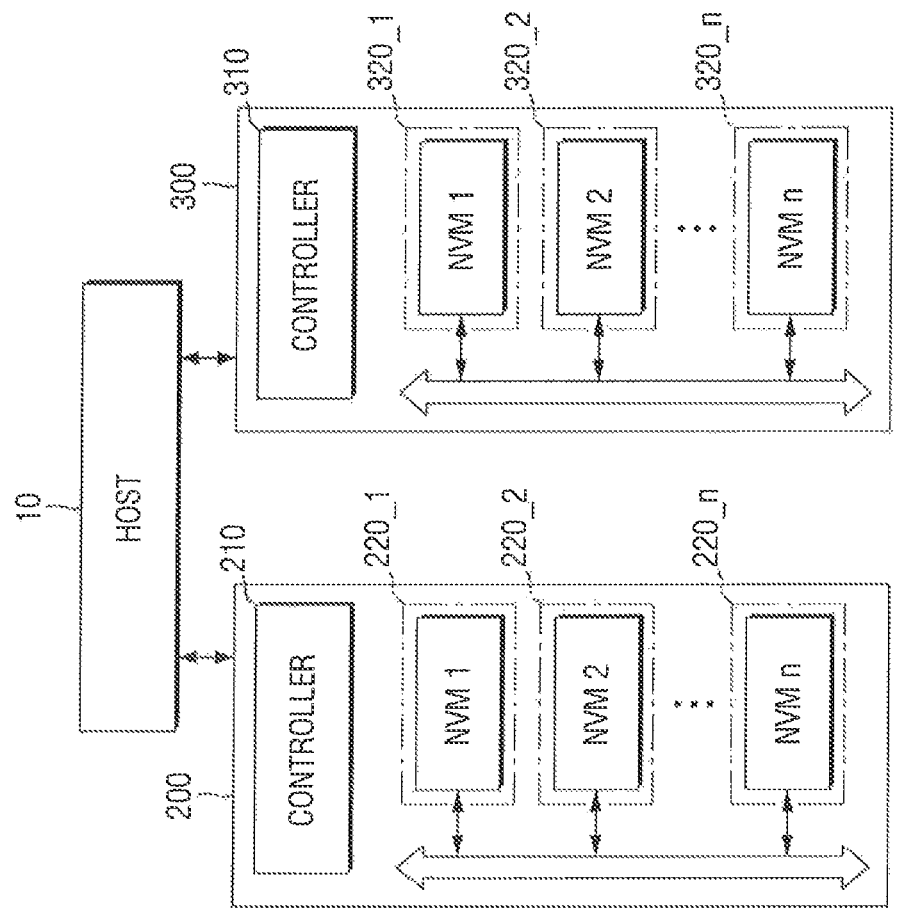
FIG. 14 is a block diagram for illustrating a storage system according to an exemplary embodiment of the present inventive concept.

FIG. 14 is a block diagram for illustrating a storage system according to an exemplary embodiment of the present inventive concept.

Referring to FIG. 14, a storage system according to an exemplary embodiment of the present inventive concept includes a host 10 (e.g., a host device such a computer), a first storage device 200, and a second storage device 300.

The host 10 may generate a request to control read, program and erase operations of the first storage device 200 and the second storage device 300.

The first storage device 200 may be, for example, a solid-state drive (SSD) including a plurality of non-volatile memories 220_1, 220_2, . . . , 220_n. The plurality of non-volatile memories 220_1 to 220_n may be packaged into, for example, a single chip.

Alternatively, the first storage device 200 may be, but is not limited to, a memory card such as a PC card or PCMCIA (personal computer memory card international association) card, a compact flash (CF) card, a smart media (SM) card or SMC, a memory stick, a multimedia card (MMC, RS-MMC or MMCmicro), an SD card, (SD, miniSD, microSD or SDHC) and universal flash storage (UFS), and the like.

The second storage device 300 may mirror the data stored in the first storage device 200. Thus, the second storage device 300 may include a configuration similar to that of the first storage device 200. The second storage device 300 may be a plurality of non-volatile memories 320_1, 320_2, . . . , 320_n, an SSD or a memory card such as a compact flash card, a smart media card, a memory stick, a multimedia card, an SD card, and a universal flash storage.

The host 10 may perform an operation similar to the controller 110 included in the above-described exemplary embodiments. Accordingly, the host may send a read request simultaneously to the first storage device 200 and the second storage device 300 that mirror each other, and may receive data provided from the first storage device 200 or the second storage device 300, whichever is earlier, while ignoring the data provided later.

The first storage device 200 includes a first controller 210 for controlling a plurality of non-volatile memories 220_1 to 220_n. The first controller 210 may process a command received from the host 10 for each of the plurality of non-volatile memories 220_1 to 220_n. That is, for two different commands that access the first non-volatile memory 220_1, the first controller 210 may process them one by one over two data cycles, instead of processing them simultaneously. The first controller 210 may include an address assignment map for converting logical addresses received from the host 10 into physical addresses corresponding to the plurality of non-volatile memories 220_1 to 220_n, respectively.

The second storage device 300 includes a second controller 310 for controlling a plurality of non-volatile memories 320_1 to 320_n. The second controller 310 may process a command received from the host 10 for each of the plurality of non-volatile memories 320_1 to 320_n. That is, for two different commands that access the second non-volatile memory 320_1, the second controller 310 may process them one by one over two data cycles, instead of processing them simultaneously. The second controller 310 may include an address assignment map for converting logical addresses received from the host 10 into physical addresses corresponding to the plurality of non-volatile memories 320_1 to 320_n, respectively.

At least one embodiment of the inventive concept provides an improvement to the functioning of a computer. For example, a computer that incorporates the storage device 100 of FIG. 1 can apply read commands to the storage device 100 and complete those read commands more quickly than a conventional computer since the controller of the storage device 100 applies address mapping rules of two mirrored memory devices in the storage device 100 differently to prevent a read operation from being performed on the same bank or to reduce the instances where the read operation is performed on the same bank. For example, when a read command for a same logical address is provided by a computer that includes a conventional storage device, the execution of the read command is delayed by a bank collision, which does not occur or is less likely to occur when the computer uses the storage device 100 of the inventive concept. Further, a computer that incorporates the storage device 100 can process erase, program, and read operations with less delay time since the controller of the storage device 100 may prevent a read operation from being performed simultaneously with an erase or a program operation. Therefore, a computer that incorporates the storage device 100 can complete operations that access (e.g., read, write, delete, etc.) the storage device 100 more quickly than a computer that includes a conventional storage device. Accordingly, a computer that incorporates the storage 100 of the inventive concept performs better than a conventional computer.

The embodiments of the inventive concept have been described with reference to the attached drawings, but it is to be understood by one of ordinary skill in the art that the inventive concept may be performed one of ordinary skill in the art in other specific forms without changing the technical concept or major features of the inventive concept.

What is claimed is:

1. A storage device comprising:
a first non-volatile memory comprising a plurality of first banks having a plurality of first addresses assigned thereto according to a first assignment policy;
a second non-volatile memory comprising a plurality of second banks having a plurality of second addresses assigned thereto according to a second assignment policy different from the first assignment policy, wherein the plurality of second addresses corresponds to the plurality of first addresses, and wherein the second non-volatile memory mirrors data items stored in the first addresses to store them in the second addresses; and a controller configured to receive a command from a host to control the first non-volatile memory and the second non-volatile memory, wherein the controller provides a read command received from the host simultaneously to the first non-volatile memory and the second non-volatile memory, and outputs to the host an earlier one between data provided from the first non-volatile memory and data provided from the second non-volatile memory based on the read command, wherein a row of a single bank of the first banks is assigned a first physical address and another row of the single bank is assigned a second physical address in the first assignment policy, and wherein the first physical address is assigned to a row of one of the second banks and the second physical address is assigned to a row of another one of the second banks in the second assignment policy.

2. The storage device of claim 1, wherein the controller receives logical addresses from the host for accessing the first non-volatile memory and the second non-volatile memory, and comprises an address assignment map for converting the logical addresses into physical addresses to assign them to the first banks and the second banks.

3. The storage device of calm 2, wherein the address assignment map comprises:
a first map for converting the logical addresses into first physical addresses assigned to the first banks; and
a second map for converting the logical addresses into second physical addresses assigned to the second banks.

4. The storage device of claim 3, wherein the first map and the second map are based on different assignment rules.

5. The storage device of claim 1, wherein the host issues an erase/program command that accesses the storage device,
wherein the controller generates from the erase/program command, a first erase/program command that accesses the first non-volatile memory and a second erase/program command that accesses the second non-volatile memory, and
wherein the controller processes the first erase/program command and the second erase/program command mutually exclusively.

6. The storage device of claim 5, wherein the second non-volatile memory performs a check to determine whether the first non-volatile memory is performing the first erase/program command, and performs the second erase/program command when the check determines the first erase/program command is not being performed.

7. The storage device of claim 6, further comprising:
a channel for inter-process communication (IPC) between the first non-volatile memory and the second non-volatile memory,
wherein the second non-volatile memory performs a check to determine whether the first non-volatile memory is performing the first erase/program command via the IPC.

8. The storage device of claim 6, further comprising:
an internal memory connected between the first non-volatile memory and the second non-volatile memory,
wherein the internal memory comprises a busy flag indicating whether the erase/program command is being performed, and
wherein the first non-volatile memory sets the busy flag when the first erase/program command is being performed.

9. The storage device of claim 5, wherein the controller comprises a command queue for storing commands issued from the host,
wherein the second non-volatile memory performs a check to determine whether a read command provided to the second non-volatile memory is present among the commands stored in the command queue, and performs the second erase/program command immediately when the check determines the read command is not present.

10. The storage device of claim 1, wherein the controller ignores a later one between data provided from the first non-volatile memory and data provided from the second non-volatile memory.

11. The storage device of claim 1, wherein the controller processes a command that is issued from the host and provided to the first non-volatile memory in each of the first banks sequentially, and processes the command in each of the second banks sequentially.

12. A method for operating a storage device comprising a first non-volatile memory comprising a plurality of first banks having a plurality of first addresses assigned thereto according to a first assignment policy, and a second non-volatile memory comprising a plurality of second banks having a plurality of second addresses assigned thereto according to a second assignment policy different from the first assignment policy, wherein the plurality of second addresses corresponds to the plurality of first addresses, and wherein the second non-volatile memory mirrors data items stored in the first addresses to store them in the second addresses, the method comprising:
issuing, by a host, a read request to the storage device;
applying, by a controller of the storage device, a read command simultaneously to the first non-volatile memory and the second non-volatile memory based on the read request;
outputting, by the controller, to the host an earlier one between data provided from the first non-volatile memory and data provided from the second non-volatile memory based on the read command,
wherein a row of a single bank of the first banks is assigned a first physical address and another row of the single bank is assigned a second physical address in the first assignment policy, and
wherein the first physical address is assigned to a row of one of the second banks and the second physical address is assigned to a row of another one of the second banks in the second assignment policy.

13. The method of claim 12, further comprising:
issuing, by the host, an erase/program command that accesses the storage device;
generating, by the controller, a first erase/program command that accesses the first non-volatile memory and a second erase/program command that accesses the second non-volatile memory, based on the issued erase/program command; and
processing, by the controller, the first erase/program command and the second erase/program command mutually exclusively.

14. The method of claim 13, wherein the processing of the first erase/program command and the second erase/program command mutually exclusively comprises:
   performing, by the controller a check to determine whether the first non-volatile memory is performing the first erase/program command, and
   performing, by the controller, the second erase/program command when the check determines the first erase/program command is not being performed.

15. The method of claim 12, further comprising:
   ignoring, by the controller, a later one between the data provided from the first non-volatile memory and the data provided from the second non-volatile memory.

16. A storage device comprising:
   a first non-volatile memory comprising M rows of N first banks having a plurality of first addresses;
   a second non-volatile memory comprising M rows of N second banks having a plurality of second addresses, wherein the plurality of second addresses corresponds to the plurality of first addresses, and wherein the second non-volatile memory mirrors data items stored in the first addresses to store them in the second addresses; and
   a controller configured to provide a read command based on a read request received from a host simultaneously to the first non-volatile memory and the second non-volatile memory, and output to the host an earlier one between data provided from the first non-volatile memory and data provided from the second non-volatile memory based on the read command, and
   wherein the controller shifts the first addresses belonging to a given row of the first banks by M mod N banks to determine the corresponding second banks of the second addresses.

17. The storage device of claim 16, wherein the read request includes logical addresses, and the controller includes a map that maps the logical addresses to first physical addresses in the first non-volatile memory and second physical addresses in the second non-volatile memory.

18. The storage device of claim 16, wherein the host issues an erase/program command that accesses the storage device,
   wherein the controller generates from the erase/program command, a first erase/program command that accesses the first non-volatile memory and a second erase/program command that accesses the second non-volatile memory, and
   wherein the controller processes the first erase/program command and the second erase/program command mutually exclusively.

* * * * *